United States Patent [19]

Sekiya et al.

[11] Patent Number: 4,782,378
[45] Date of Patent: Nov. 1, 1988

[54] TRANSISTOR HAVING INTEGRATED STABILIZING RESISTOR AND METHOD OF MAKING THEREOF

[75] Inventors: Tsuneto Sekiya; Shinichi Ito; Hisao Shigekane, all of Kanagawa, Japan

[73] Assignee: Fuji Electric Co., Ltd., Kanagawa, Japan

[21] Appl. No.: 124,403

[22] Filed: Nov. 18, 1987

Related U.S. Application Data

[63] Continuation of Ser. No. 813,334, Dec. 26, 1985, abandoned, which is a continuation-in-part of Ser. No. 469,055, Feb. 23, 1983, abandoned.

[30] Foreign Application Priority Data

Feb. 25, 1982 [JP] Japan .................................. 57-29290

[51] Int. Cl.$^4$ ..................... H01L 29/72; H01L 29/08; H01L 29/52
[52] U.S. Cl. ........................................ 357/34; 357/36; 357/46; 357/51
[58] Field of Search ........................ 357/34, 36, 46, 51

[56] References Cited

U.S. PATENT DOCUMENTS 3,597,640  8/1971  Kubinec .................................. 357/46

FOREIGN PATENT DOCUMENTS 53-82178   7/1978  Japan ..................................... 357/46
54-104779  8/1979  Japan ..................................... 357/51
58-147064  9/1983  Japan ..................................... 357/46

OTHER PUBLICATIONS

Hamilton & Howard, "Basic Integrated Circuit Engineering", copyright 1975, p. 7.

Primary Examiner—Andrew J. James
Assistant Examiner—John Lamont
Attorney, Agent, or Firm—Sughrue, Mion, Zinn, Macpeak, and Seas

[57] ABSTRACT

A resistively stabilized transistor in which secondary breakdown is prevented by the insertion of a floating emitter protection region around only one end of a stabilizing resistive region. The transistor includes an ordinary emitter region located within a base region. A floating emitter region surrounds the ordinary emitter region. An elongated stabilizing resistive region has one end connected to the ordinary emitter region and the other to the base region. The protection region is positioned around, but spaced from, an end portion of the stabilizing resistive region only in the area where the resistive region connects to the ordinary emitter region.

5 Claims, 3 Drawing Sheets

TRANSISTOR HAVING INTEGRATED STABILIZING RESISTOR AND METHOD OF MAKING THEREOF

This is a continuation of Ser. No. 813,334, filed on Dec. 26, 1985, now abandoned, which is a continuation-in-part of Ser. No. 469,055 filed on Feb. 23, 1983, now abandoned.

BACKGROUND OF THE INVENTION

It has long been known that a transistor may be stabilized, as shown in FIG. 1, by connecting a resistor R between the base B and the emitter E of the transistor. It has also been known to form the resistor R by a diffusion in the same semiconductor body in which the transistor itself is formed.

In some transistors, a so-called "floating" emitter of the same conductivity type as the ordinary emitter of the transistor is formed surrounding the ordinary emitter in order to enhance the ASO (Area of Safe Operation) characteristic of the transistor. FIG. 2 shows such a transistor provided both with a stabilizing resistor and a floating emitter.

In this transistor, a P-type base region 2 is first formed by diffusion in an N-type silicon wafer 1. Next, an N-type emitter region 3 is formed in the base region 2. A ring-like region 4 surrounding the emitter region 3 forms the floating emitter. An elongated resistive region 5, which acts as the stabilizing resistor R, is formed in the same diffusion step used to form the ordinary emitter region. The resistive region 5 is connected between the base region 2 and the emitter region 3 through respective metal electrodes 6 and 7.

Since the impedance to the emitter 3 from the part of the resistive region 5 closest to the emitter 3 is small, and as that part of the resistive region 5 is at substantially the same potential as the emitter region 3, this part of the resistive region 5 causes an unwanted transistor action to occur. Hence, there is a problem with this device in that secondary breakdown can occur in this area so as to cancel out the advantageous effects provided by the floating emitter.

To overcome this problem, there has been proposed an arrangement, as shown in FIG. 3, in which resistive region 5 is entirely surrounded by an N-type region 8. This approach, however, has not been found to be completely acceptable for various reasons, including the fact that a relatively large amount of wafer surface area is required.

Accordingly, it is an object of the present invention to provide a transistor in which the above-mentioned secondary breakdown due to the presence of the resistive region is eliminated.

It is also an object of this invention to define a transistor structure wherein the base electrode is positioned close to the emitter end of a resistive region.

SUMMARY OF THE INVENTION

This, as well as other objects of the invention, is attained by providing in a transistor of the type illustrated in FIG. 2, a protective region having the same conductivity type as the ordinary emitter region and only partially surrounding the stabilizing resistive region. This protective region is located at a position which is close to, but spaced from, the end of the resistive region whre it connects to the ordinary emitter region, with the periphery of the resistive region at that end, and only at that end, having the protective region. The minimum distance is in the range of 10 μm, which is determined by the technique of manufacture.

DESCRIPTION OF THE PREFERRED EMBODIMENT

Figure 1:
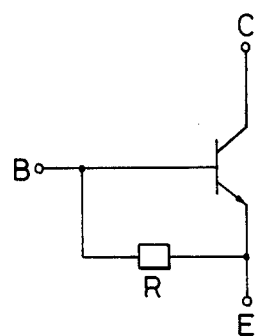
FIG. 1 is a circuit diagram of a transistor to which the present invention is applied.
Figure 2:
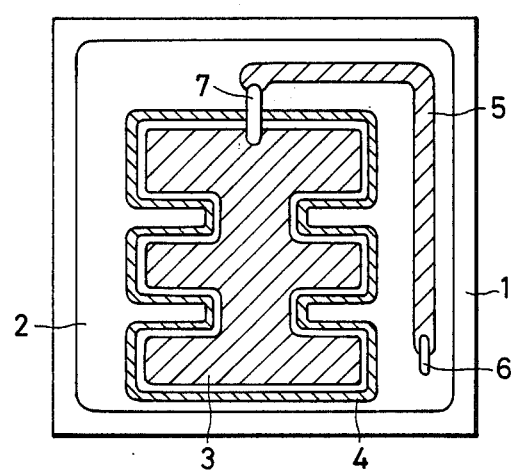
FIG. 2 is a plan view of an example of a conventional transistor of the type illustrated in FIG. 1.
Figure 3:
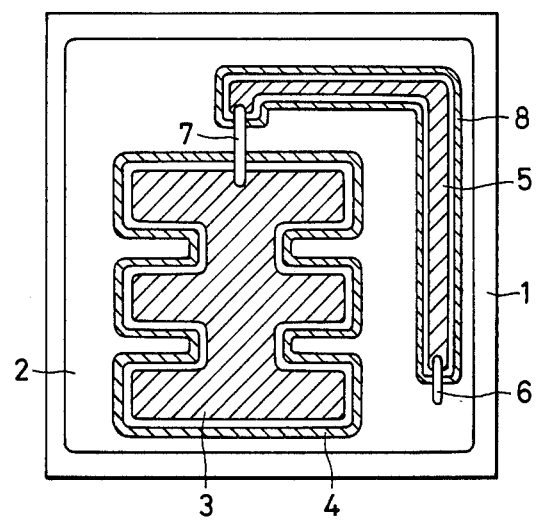
FIG. 3 is a plan view of another example of a conventional transistor of this type.
Figure 6:
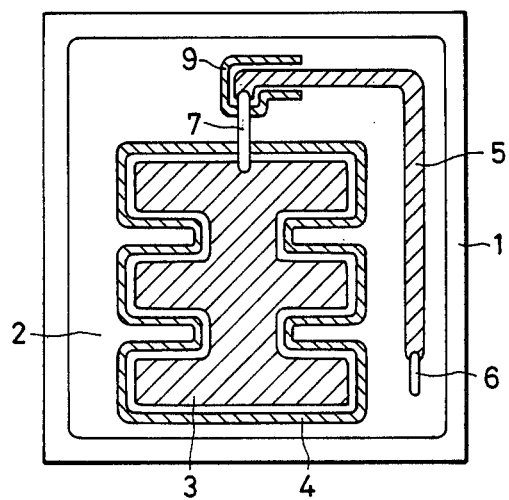
FIG. 6 is a plan view of a preferred embodiment of a completed transistor of the present invention.

Referring now to FIG. 6, in which the same elements as are common to the arrangements of FIGS. 2 and 3 are identified by like reference numerals, a completed transistor structure is illustrated. A floating emitter N-type region 9 (of the same conductivity type as the emitter region 3, the elongated resistive region 5 and the floating emitter 4) is provided at a position close to the resistive region 5 at the end thereof, and only at the end thereof, which connects to the emitter region 3. The N-type region 9 can be formed by a diffusion step, in the same manner as the regions mentioned above.

Figure 4:
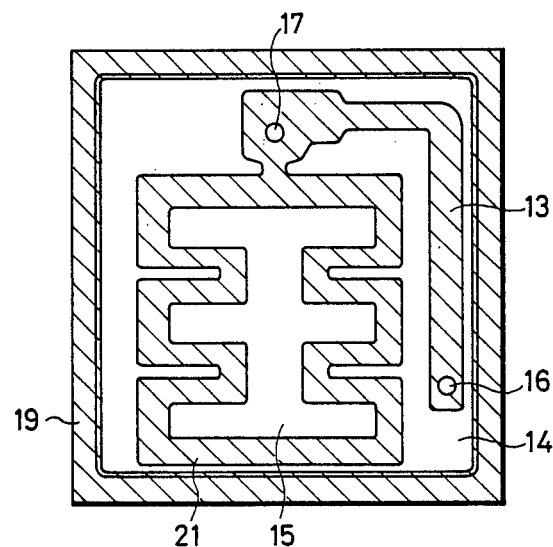
FIG. 4 illustrates the SiO$_2$ pattern of the transistor chip following completion of the diffusion step, but prior to formation of the electrode patter.
Figure 5:
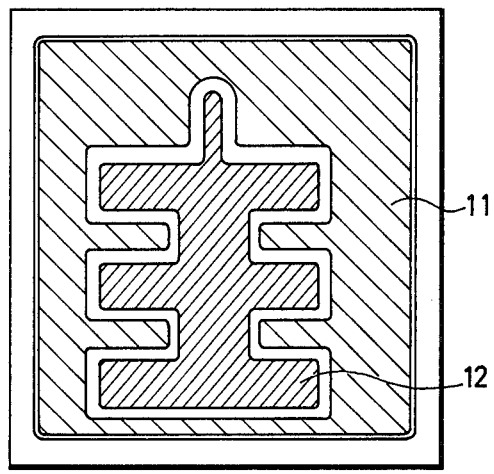
FIG. 5 illustrates the electrode pattern of the base and emitter electrodes.

Referring now to FIGS. 2, 4 and 5, the method of manufacturing the transistor of FIG. 6 will be explained. First, onto an N-type semiconductor wafer a P-type base region 2 is formed. This is accomplished by diffusion into a silicon substrate. An N-type emitter region 3 and elongated resistive region 5 are formed by appropriate diffusion in the base region. A blanket oxide layer is deposited and by masking and etching forms the SiO$_2$ pattern of FIG. 4. In FIG. 4, the oxide pattern comprises a frame 19 surrounding the base region 14 (unmasked) and an oxide border 21 for the emitter region 15. The SiO$_2$ covers the region 13 where the resistive region 5 is to be formed. The pattern is opened at holes 16 and 17 to provide contacts for subsequent metalization defining electrodes 6 and 7. FIG. 4 illustrates the SiO$_2$ pattern following the diffusion step but prior to formation of the electrode pattern. In FIG. 5, the electrode pattern is illustrated. The base electrode 11 surrounds the emitter region 3. The emitter electrode 12 is connected to the emitter region 3. The configuration of the emitter electrode distributed emitter action uniformly in the entire emitter region. The device is completed in a manner similar to the prior art device of FIG. 3 except that the N-type floating emitter region 9 is provided only at the end of the resistive region 5 connected to the emitter region 3. Moreover, the distance between the floating emitter region 9 and the resistive region 5 is the range of 10 μm.

With this arrangement wherein the region 9, which acts as a floating emitter, is positioned adjacent only to a relatively small part of the resistive region 5, only a relatively small part of the resistive region 5 can act as transistor emitter. This prevents the occurrence of secondary breakdown. Also the arrangement of the invention is advantageous in that the small extent of the region 9 permits a reduction in the semiconductor area required for forming the device.

As mentioned above, in accordance with the present invention, secondary breakdown, which would otherwise occur due to transistor action at the end portion of the resistive region inserted between the base and emitter of the transistor, is prevented. By restricting the extent of the floating emitter region to one end of the stabilizing resistive region, not only is there an improvement in the ASO characteristics of the transistor, but a transistor is provided which makes economical use of the available wafer area.

The invention is not restricted to an NPN transistor, and can be implemented in the form of a PNP transistor in the same manner as described above.

We claim:

1. A transistor comprising: an emitter region, a base region having a base electrode, and a collector region, said emitter region being located within said base region; an elongated resistive region of the same conductivity type as said emitter region, said emitter region and said elongated resistive region defined by a single silicon dioxide pattern and a base electrode pattern surrounding said emitter region a first end of said resistive region being connected to said emitter region and a second end of said resistive region being connected to said base region wherein said second end is formed close to said base electrode so that additional resistance to a current through the base region prevents the occurrence of secondary breakdown; and a partially surrounding floating emitter region of the same conductivity type as said emitter region, said partially surrounding floating emitter region only being located spaced apart from and around said first end of said resistive region such that said partially surrounding floating emitter region acts as a floating emitter and prevents the occurrence of secondary breakdown.

2. The transistor of claim 1, wherein said partially surrounding floating emitter region is separated from said resistive region by a narrow gap greater than 10 μm.

3. The transistor of claim 2, wherein portions of said partially surrounding floating emitter region are positioned on both sides of said first end of said resistive region.

4. The transistor of claim 1, wherein said transistor is an NPN transistor.

5. The transistor of claim 1, wherein said transistor is a PNP transistor.

* * * * *